United States Patent
Roohparvar

(10) Patent No.: US 7,466,600 B2
(45) Date of Patent: Dec. 16, 2008

(54) SYSTEM AND METHOD FOR INITIATING A BAD BLOCK DISABLE PROCESS IN A NON-VOLATILE MEMORY

(75) Inventor: Frankie Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 259 days.

(21) Appl. No.: 11/499,231

(22) Filed: Aug. 3, 2006

(65) Prior Publication Data

US 2008/0031061 A1 Feb. 7, 2008

(51) Int. Cl.
*G11C 7/00* (2006.01)
(52) U.S. Cl. ............. 365/189.05; 365/200; 365/230.08
(58) Field of Classification Search ............ 365/189.05, 365/200, 230.08
See application file for complete search history.

(56) References Cited

U.S. PATENT DOCUMENTS

| | | | |
|---|---|---|---|
| 5,596,530 A | 1/1997 | Lin et al. ............... | 365/185.29 |
| 5,864,499 A | 1/1999 | Roohparvar et al. ... | 365/185.08 |
| 6,000,004 A | 12/1999 | Fukumoto .................... | 711/103 |
| 6,512,711 B1 * | 1/2003 | Wright et al. ............... | 365/203 |
| 6,826,081 B2 | 11/2004 | Nagashima et al. .... | 365/185.09 |
| 7,035,152 B1 * | 4/2006 | Bae et al. ..................... | 365/200 |
| 2004/0080998 A1 | 4/2004 | Chang et al. ................ | 365/200 |
| 2005/0144360 A1 | 6/2005 | Bennett et al. .............. | 711/103 |
| 2005/0286337 A1 | 12/2005 | Louie et al. .................. | 365/232 |
| 2006/0013048 A1 | 1/2006 | Kim ........................... | 365/200 |
| 2006/0059383 A1 | 3/2006 | Roohparvar .................... | 714/5 |
| 2006/0098484 A1 | 5/2006 | Roohparvar ........... | 365/185.09 |

* cited by examiner

*Primary Examiner*—Son Dinh
(74) *Attorney, Agent, or Firm*—Dorsey & Whitney LLP

(57) ABSTRACT

A system and method for disabling access to individually addressable regions of an array of non-volatile memory. In response to receiving an initial valid command, a process for disabling access to the defective portions of the array of non-volatile memory is initiated in addition to executing the initial valid command. One implementation provides receiving a memory command and determining whether an indicator has been set. In response to the indicator not being set, access to defective regions of the array of non-volatile memory is disabled in addition to executing the memory command. The indicator is also set to prevent the disabling process from being performed in response to receipt of subsequent memory commands.

21 Claims, 3 Drawing Sheets

SYSTEM AND METHOD FOR INITIATING A BAD BLOCK DISABLE PROCESS IN A NON-VOLATILE MEMORY

TECHNICAL FIELD

The invention relates generally to non-volatile memory, and more particularly, to disabling access to bad blocks of memory following initialization of the non-volatile memory.

BACKGROUND OF THE INVENTION

Non-volatile memory is memory that can continue to store data after power is no longer provided to the memory. "Flash memory," called this because data can be erased from multiple memory cells simultaneously, is an example of non-volatile memory. A typical flash memory comprises an array of memory cells having the cells arranged in rows and columns of memory. The array is broken down into blocks of memory cells. Although each of the cells within a block can be electrically programmed to store data individually, data is erased from the cells at the block level.

A common example of flash memory is NAND flash memory. The array of memory cells for NAND flash memory devices are arranged such that a control gate of each memory cell of a row of the array is connected to a word line. However, each memory cell is not directly connected to a column bit line. Instead, the memory cells of the array are arranged together in strings ("NAND strings"), with the memory cells connected together in series, source to drain, between a source line and a column bit line. The NAND strings can have as many as 32 memory cells between the source line and the column bit line.

The memory array for NAND flash memory devices is then accessed by a row decoder activating a row of memory cells by selecting the word line connecting the control gates of the memory cells. In addition, the word lines connected to the control gates of unselected memory cells of each string are driven so that the respective memory cell passes current in a manner that is unrestricted by their stored data values. Current then flows from the source line to the column bit line through each series connected string, restricted only by the selected memory cells of each string. This places the current-encoded data values of the row of selected memory cells on the column bit lines to be sense and amplified before being output as data, as well known.

NAND flash memory is designed to serve as a low cost solid state mass storage medium. As a result, standard specifications for NAND flash memory allow a manufacturer to sell NAND flash devices having a percentage of non-functional blocks of memory, or "initial bad blocks" of memory. Allowing for bad blocks of memory increases the effective yield of marketable devices, thereby lowering costs. The bad blocks do not affect the performance of good blocks of memory because each block is independently accessible.

Generally the process of identifying initial bad blocks occurs during testing by the manufacturer. A conventional manner of marking the bad blocks is to program non-FF data at specific locations within each bad block. Upon use by a user, a bad block disable process is performed. The specific locations are queried to identify which blocks of memory are bad. Control logic included in the memory device identifies the bad blocks by checking for the non-FF data, and if present, the block can be disabled using a conventional technique of setting a latch in the respective block decoder circuits for the bad block. Setting the latch prevents access to the bad block and provides a hardware mechanism for disabling bad blocks prior to operation.

Although the technique of using non-FF data is effective in marking initial bad blocks, some users choose not to read the array for the bad block information prior to use, and simply erase the entire array. As a result, the non-FF data programmed to identify the bad blocks are erased, thus, eliminating any way to identify which blocks are bad after the erasing process.

In order to enable identification of bad blocks even in the case where the entire memory array is erased prior to use, a technique of programming initial bad block information in a user-inaccessible memory has been used. One technique for programming bad block information to user-inaccessible memory is to program the initial bad block information into specific circuits designed to store this information. An example of this type of circuit is described in U.S. Pat. No. 5,864,499 to Roohparvar et al. The circuits are small arrays of non-volatile memory cells having dedicated sense amplifiers. The memory cells can be programmed and function as "fuses" to store information identifying the initial bad blocks. One problem resulting from this approach is that as the number of memory blocks in a memory device increases, and there are a greater absolute number of bad blocks, the number of the dedicated "fuse circuits" must also increase. The additional fuse circuits occupy more space on the die, which is generally undesirable.

Another approach to storing initial bad block information is to store the information at locations in the memory array that are inaccessible to the user. For example, a One-Time Programmable ("OTP") area can be programmed with the initial bad block information. The OTP area is restricted from access by the user. The OTP area is typically functionally the same as any other memory block in the array, that is, it is not specially designed for the purpose of storing bad block information. Information cataloging the bad blocks identified during testing can be stored in the OTP area for use by the controller during initialization to set latches in the respective block decoders and disable access to the bad blocks.

In the technique where bad block information is programmed in a user-inaccessible memory block, a voltage detection circuit is typically used to trigger the bad block disable process. That is, when the voltage detection circuit detects an increasing device supply voltage VCC that exceeds a trigger voltage, the control logic begins the bad block disable process. The trigger voltage is selected low enough so that the bad blocks of memory are disabled and the device is ready for use by the time VCC reaches a specified range of operation. Taking into account process variations which can affect the trigger voltage at which the voltage detection circuit triggers the control logic to begin the bad block disable process, a typical trigger voltage is 2.5 Volts for a nominal VCC of 3.3 Volts (acceptable voltage range of 2.7-3.6 Volts).

A problem with this approach results from the desire to operate memory devices at lower device supply voltages, for example, at a nominal VCC of 1.8 Volts (acceptable voltage range of 1.5-2.0 Volts). A suitable trigger voltage that takes into account process variations and the relationship with VCC so that the device is operational when device supply voltage stabilizes would need to be as low 1.2 Volts. At this voltage level, however, reading data stored in the memory array, of which the OTP area is a part, is unreliable. Consequently, reading bad block information stored in the OTP area at this lower voltage may result in incorrect data, resulting in erroneous identification of bad blocks.

Additionally, voltage detection circuits that can accurately and consistently detect lower trigger voltages are difficult to design for applications where the reference voltage is derived from the same voltage being monitored, namely, VCC.

Although dedicated "fuse circuits" could be reliably read at lower trigger voltages, storing bad block information in the dedicated circuits is undesirable because the circuits occupy more space on the die than is desirable, as previously discussed.

Another approach is to provide a reset pin on the memory device that can be used to trigger the read-latch set operation. However, providing a reset signal to the reset pin of the device would need to be supported by a system memory controller, thus, complicating the architecture of the system, not to mention that it is generally undesirable to add pins to a device due to package constraints.

Therefore, there is a need for an alternative system and method for initiating a bad block disable process that can reliably disable access to bad blocks of memory.

DETAILED DESCRIPTION OF PREFERRED EMBODIMENTS

Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
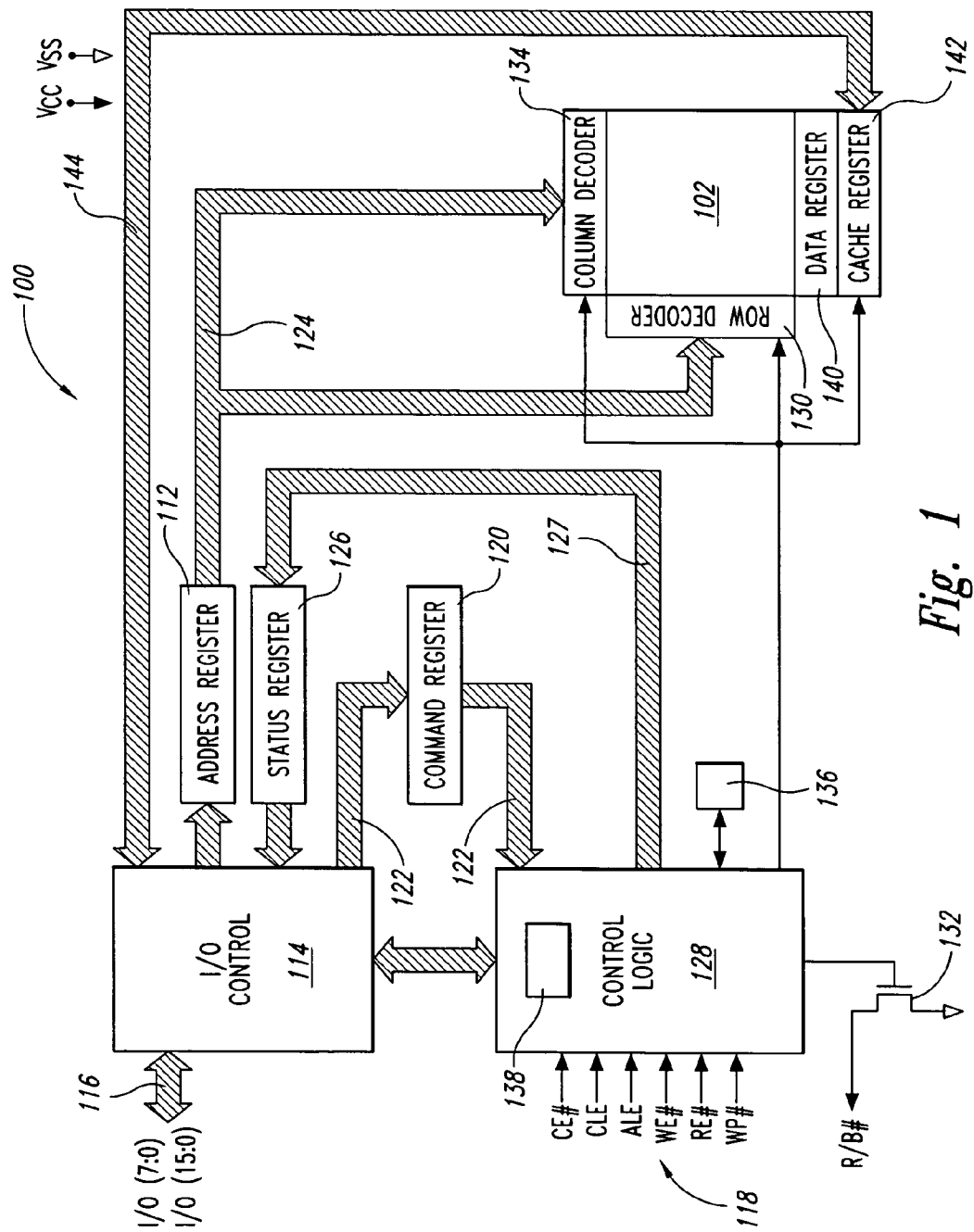
FIG. 1 is a simplified block diagram of a NAND flash memory according to an embodiment of the present invention.

FIG. 1 is a simplified block diagram of a portion of a flash memory device 100 according to an embodiment of the present invention. As shown in FIG. 1, the memory device 100 has been simplified to focus on features of the memory that are helpful in understanding the present invention. A more detailed understanding of internal circuitry and functions of flash memories are known to those skilled in the art. The memory device 100 includes a memory array 102 having a plurality of memory cells arranged in row and column fashion. Each of the memory cells includes a floating-gate field-effect transistor capable of holding a charge for the non-volatile storage of data. Each of the cells can be electrically programmed on an individual basis by charging the floating gate. The rows of memory array 102 are arranged in blocks, where a memory block is some discrete portion of the memory array 102. The memory cells generally can be erased in blocks. Data, however, may be stored in the memory array 102 in finder increments than a memory block. Row decoder and column decoder circuits 130, 134 decode memory addresses to access the corresponding memory locations in the memory array 102. Data register 140 and optional cache register 142 temporarily store data read from, or to be written to the memory array 102.

Command, data and address signals are provided to an I/O control 114 on device bus 116, which is multiplexed for receiving the various signals. Which of the various signals are being received is determined by control signals 118 provided to a control logic 128. In response to control signals 118 indicating that command signals are being provided on the device bus 116 to the I/O control 114, the command signals are received by the I/O control 114 and the corresponding commands are latched by a command register 120. The latched command is provided to the control logic 128 via internal command bus 122, where the commands are decoded and corresponding internal control signals are generated by the control logic 128 to perform the requested commands. In response to the control signals 118 indicating that address signals are being provided on the device bus 116 to the I/O control 114, the address signals are received and the corresponding addresses are latched in an address register 112. A status register 126 is used to latch status information provided to it over an internal status bus 127 from the control logic 128. The status information is generated by the control logic 128 in response to receiving a command requesting the status of an operation.

The control logic 128 is coupled to a transistor 132 to provide a ready/busy signal R/B# that can be used for indicating the completion of various memory operations. The signal is typically HIGH, and transitions to LOW after a command is written to the device. When the current memory operation is completed, the R/B# signal transitions back to HIGH. A bad block disable latch 136 coupled to the control logic 128 can be set to indicate that a bad block disable process has been performed. As will be described in more detail below, upon initialization of the memory device 100, the bad block disable latch 136 is set to a first state. Upon receiving a valid command, bad block disable latch logic 138 included in the control logic 128 checks the state of the bad block disable latch 136 to determine if a bad block disable process has been performed. Examples of commands include a program command to program memory cells to store data and an erase command to erase the data of a block of memory. Other valid commands or combinations of valid commands can be used as well. If the bad block disable latch 136 set to a first state, the control logic 128 executes the bad block disable process and sets the bad block disable latch 136 to a second state. Upon receipt of subsequent valid commands, the bad block disable latch logic 138 checks the status of the bad block disable latch 136. As the latch 136 is now set to the second state, the control logic 128 does not perform the bad block disable process.

In operation, the memory array 102 can be accessed by providing a combination of control, command, and address signals. For example, to perform a read operation, a first combination of control signals 118 is provided to the control logic 128 to indicate that command signals are applied to the device bus 116. The control logic 128 generates internal control signals for the I/O control 114 to receive the command signals and for the corresponding command to be latched in the command register 128. The control logic 128 decodes the read command and begins to generate internal control signals for accessing the memory array 102.

A second combination of control signals 118 is provided to the control logic 128 to indicate that address signals are applied to the device bus 116. The control logic generates internal control signals for the I/O control 114 to receive the address signals and for the corresponding addresses to be latched in the address register 112. The addresses are provided to a row decoder circuit 130 and a column decoder circuit 134 via an internal address bus 124 for decoding the addresses and accessing the memory locations corresponding to the latched addresses.

A page of memory cells having the memory locations to be accessed is read from the memory array 102 and stored in a data register 140. The data from the page of memory is transferred to a secondary (and optional) cache register 142 before being provided to the I/O control 114 on an internal data bus 144. The cache register can be used to temporarily store the page of data in order to free the data register 140 to store another page of data for a subsequent access operation of the memory array 102. The page of data is transferred to the I/O control 114 from the cache register 142. Based on the addresses, the appropriate data from the page of data is output on the device bus 116.

A write operation occurs in a similar manner except that following the second combination of control signals a third combination of control signals are provided to the control logic 128 indicating that data to be written to the memory locations corresponding to the addresses is being provided on the device bus 116. The data received by the I/O control 114 is provided on the internal data bus 144 to the cache register 142 for writing to the memory array 102.

Figure 2:
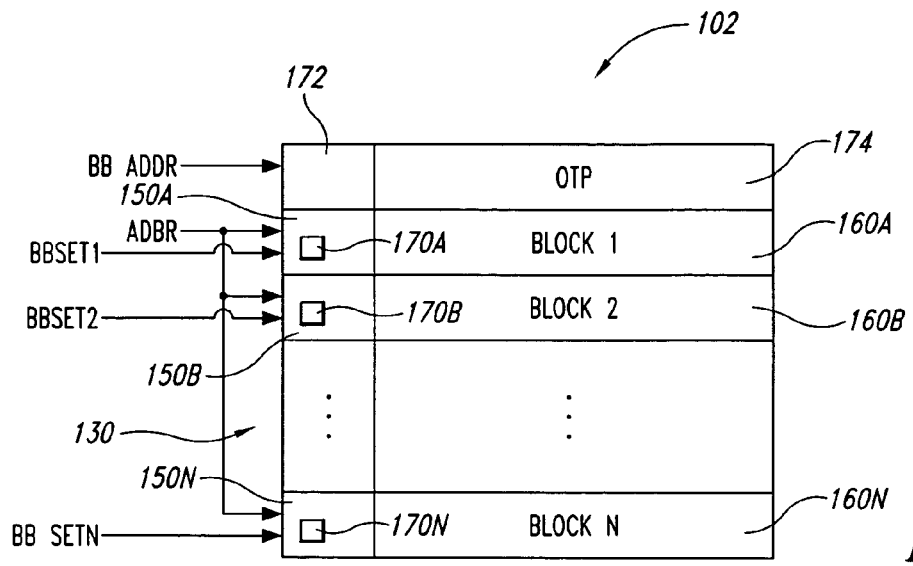
FIG. 2 is a simplified block diagram of a portion of the memory array and row decoder circuit of the NAND flash memory of FIG. 1.

FIG. 2 illustrates a portion of the memory array 102 and the row decode circuit 130 shown in FIG. 1. As previously discussed, the memory array 102 is divided into memory blocks 160A-160N. The row decoder 130 includes block decoder circuits 150A-150N for enabling access to a respective memory block 160A-160N. The block decoder circuits 150 receive addresses from the address register 112 (FIG. 1) for selecting the correct memory block 160 to access. Including in each block decoder circuit 150A-150N is a block decoder disable latch 170A-170N, which can be set by a respective block decoder disable signal BBSET1-BBSETN generated by the control logic 128 in response to reading bad block information. As previously discussed, the block decoder disable latches 170A-170N can be set to disable access to the respective memory block 160. The block decoder disable latch 170A-170N is typically set during or at a time following initialization of the memory device 100.

A one-time programmable ("OTP") memory block 174 is also included in the memory array 102. In one embodiment of the present invention, the OTP memory block is not accessible by the user and stores bad block information for initial bad blocks identified during testing of the device by the manufacturer, as previously described. A corresponding block decoder circuit 172 provides access to the OTP memory block 174 by the control logic 128 for reading the bad block information, as will be described in more detail below.

Figure 3:
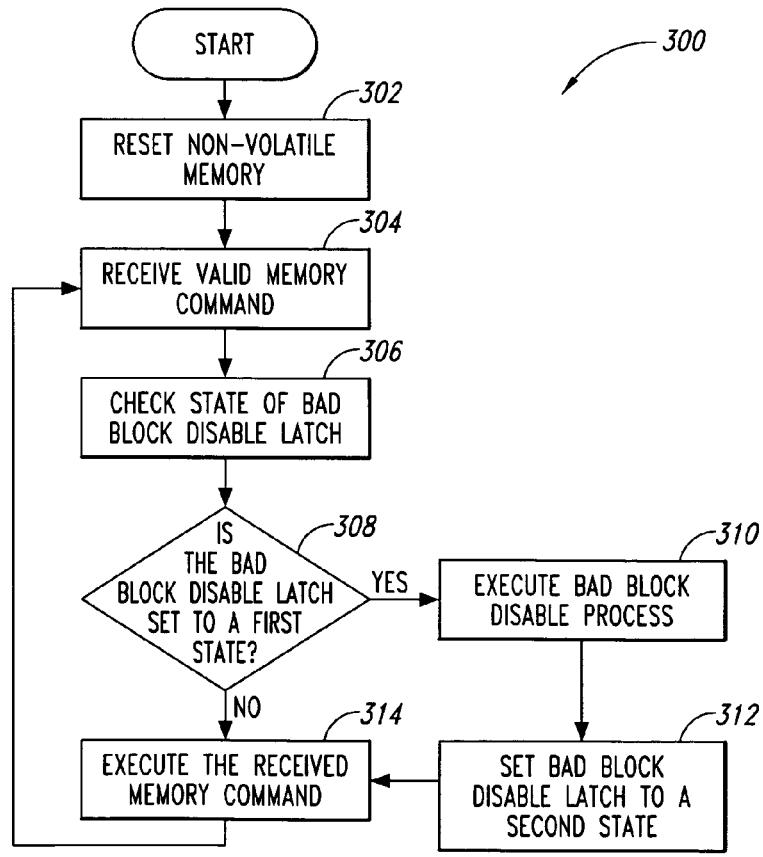
FIG. 3 is a flow diagram for performing a bad block disable process according to an embodiment of the present invention.
Figure 4:
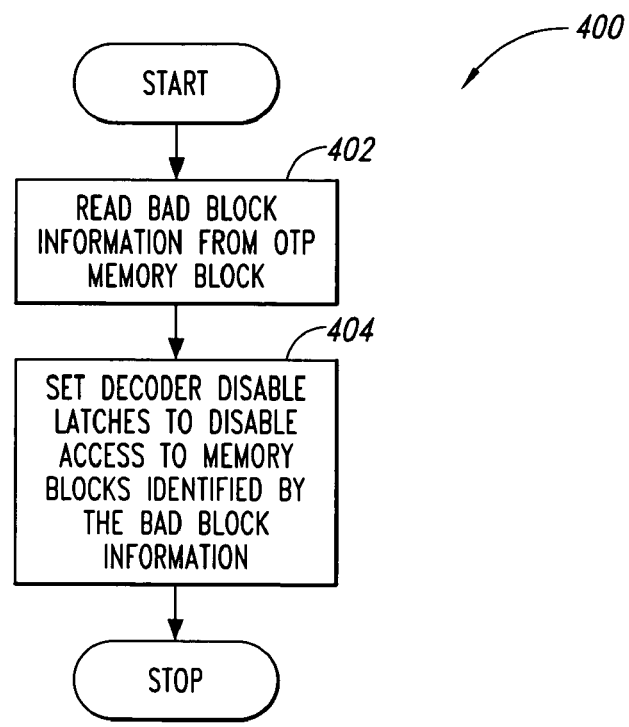
FIG. 4 is a flow diagram for a bad block disable process according to an embodiment of the present invention.

FIG. 3 is a flow diagram for initiating a bad block disable process according to an embodiment of the present invention. At step 302, the memory device 100 is reset, for example, when power is initially applied. The memory device 100 waits until a valid command is received at step 304, and in response, the bad block disable latch logic 138 checks the state of the bad block disable latch 136 to determine if a bad block disable process has been performed. At step 308, if the bad block disable latch 136 is set to a first state, indicating that the bad block disable process has not been performed, the control logic 128 executes the bad block disable routine at step 310. FIG. 4 is a flow diagram illustrating a bad block disable process 400 according to an embodiment of the present invention. At step 402 the control logic 128 accesses the OTP memory block 174 (FIG. 2) by providing addresses BBADDR through the I/O control 114 (FIG. 1) and address register 112 to the row decode circuit 130 and the column decode circuit 134. The addresses BBADDR correspond to memory locations at which the bad block information is stored. The bad block information is internally provided to the control logic 128 and based on the bad block information, the appropriate block decoder disable latches 170 are set at step 404 to disable access to the bad blocks.

The bad block disable latch 136 is set to a second state at step 312, thus indicating that the bad block disable process has been performed, and the valid command received at step 304 is executed at step 314. The memory device then waits for a subsequent valid command by returning to step 304. Upon receiving the next valid command at step 304, the control logic 128 checks the state of the bad block disable latch 136 at step 306. Assuming that the current valid command is not the first valid command received by the memory device 100 after reset, the bad block disable latch 306 should be already set to a second state in response to receiving a previous valid command. As a result, the control logic 128 does not execute a bad block disable process, but executes the received command at step 314.

As illustrated above, rather than relying on an increasing VCC reaching a trigger voltage to initiate the bad block disable process, the control logic 128 checks the state of the bad block disable latch 136 in response to receiving valid commands. In summary, if the bad block disable latch 136 is set to a first state, the control logic 128 does not immediately perform the command, but executes a bad block disable process that includes reading read bad block information programmed in the OTP memory block 174 and setting the block disable latches 170 of the respective block decoder circuits 150 to disable access to bad blocks of memory. The bad block disable latch 136 is set to a second state so that when the next valid command is received, the bad block disable process is not performed again. The delayed command is then performed. As a result, the first valid command the memory device 100 receives after initialization triggers the bad block disable process.

Using the first valid command as the trigger for the bad block disable process avoids the possibility that the increasing VCC is at too low of a voltage for accurately reading bad block information from the OTP memory block 174. Generally, the first valid command is indicative of the system being ready for operation, including having a sufficient and stable VCC. Although using the first valid command to initiate the bad block disable process delays execution of the first valid command, it is only the first command after initialization that is delayed. Thereafter, all commands will be processed normally since the bad block disable latch 136 is set to a second state indicating that the bad block disable process has already been performed. Consequently, on average, the access performance of the memory device 100 is minimally affected.

In the previous embodiments, bad block information for initial bad blocks is programmed in the OTP memory block 174 during testing of the memory device 100 by the manufacturer. The bad block information is used to disable access to the bad blocks at a hardware level, that is, by setting block decoder disable latches 170. In those embodiments, the OTP memory block has been described as being inaccessible by the user. In these embodiments, bad memory blocks that develop later during ordinary use of the memory device 100 are typically handled at a software level using conventional bad block management schemes.

In alternative embodiments of the present invention, bad memory blocks that develop during use can be hardware disabled by allowing a user to write bad block information to memory locations in the memory array 102 which is then read by the control logic 128 when performing a bad block disable process. That is, as with the bad block information for the initial bad blocks identified during testing, the user programmed bad block information can be read by the control logic 128, and based on the user programmed bad block information, the appropriate bad block decode latches 170 can be set to disable access to the corresponding bad blocks of memory.

In these embodiments, bad block information cataloging the initial bad blocks identified at testing are written to a non-volatile memory location, as previously discussed. The bad block disable process and triggering of the process based on receipt of the first valid command is the same as previously described. However, in addition to reading the bad block information for the initial bad blocks, user programmed bad block information identifying bad blocks that develop from use is also read. All of the block decode disable latches 170 in the block decoder circuits 150 corresponding to the bad block information (both for initial bad blocks and bad blocks that develop from use) are set to disable access to both the initial bad blocks and the developed bad blocks. As a result, access to both the initial bad blocks and the bad blocks that develop during use can be hardware disabled during the bad block disable process.

Although various embodiments of the present invention have been described as having bad block information for initial bad blocks programmed in a user-inaccessible OTP memory block 172, in other embodiments the bad block information for the initial bad blocks is programmed in a user-accessible memory block or to a user-inaccessible memory block other than the OTP memory block. In another embodiment, bad block information is programmed in fuse circuits, which were previously discussed. In other embodiments, bad block information for initial bad blocks and user programmed bad block information for bad blocks that develop during use can be stored in the same or different memory blocks.

Figure 5:
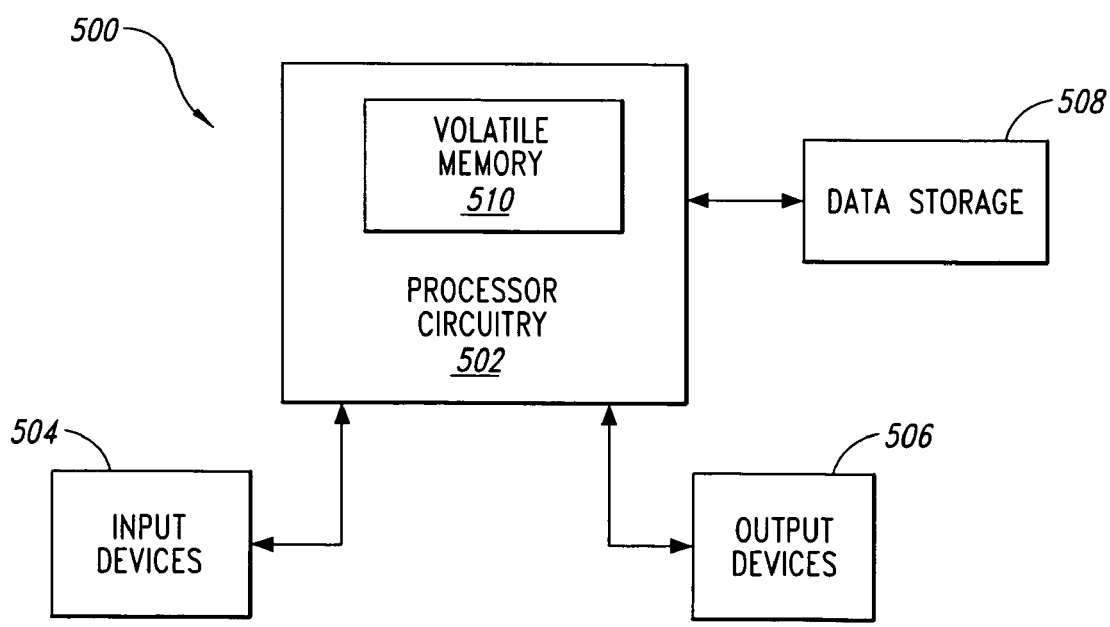
FIG. 5 is a simplified block diagram of a processor-based system including non-volatile data storage according to an embodiment of the present invention.

FIG. 5 is a block diagram of a processor-based system 500 including processor circuitry 502 having volatile memory 510. The processor circuitry 502 is coupled through address, data, and control buses to the volatile memory 510 to provide for writing data to and reading data from the volatile memory 510. The processor circuitry 502 includes circuitry for performing various processing functions, such as executing specific software to perform specific calculations or tasks. The processor-based system 500 also includes one or more input devices 504 coupled to the processor circuitry 502 to allow an operator to interface with the processor-based system 500. Examples of input devices 504 include keypads, touch screens, and scroll wheels. The processor-based system 500 also includes one or more output devices 506 coupled to the processor circuitry 502 to provide output information to the operator. In one embodiment, the output device 506 is a visual display providing visual information to the operator. Data storage 508 is also coupled to the processor circuitry 502 to store data that is to be retained even when power is not supplied to the processor-based system 500 or to the data storage 508. The NAND memory 100, or another embodiment of a NAND memory according to the present invention, can be used for the data storage 508.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A non-volatile memory, comprising:
an array of non-volatile memory having a plurality of addressable regions;
a memory operable to store data;
an address decoder coupled to the array and operable to provide access to the addressable regions;
a latch operable to be set to a first state or a second state; and
control logic coupled to the memory, address decoder and latch, and operable to query the state of the latch in response to receiving a memory command, in response to the latch having a first state, the control logic operable to read data stored in the memory, set the latch from the first state to the second state, and disable access to defective addressable regions of the array of non-volatile memory identified by the stored data prior to executing the received memory command, in response to the latch having a second state, the control logic operable to execute the received memory command without disabling access to defective addressable regions of the array.

2. The non-volatile memory of claim 1 wherein the memory operable to store data comprises a region of memory in the array of non-volatile memory.

3. The non-volatile memory of claim 2 wherein the region of memory in the array of non-volatile memory comprises a region of memory inaccessible by a user of the non-volatile memory.

4. The non-volatile memory of claim 1 wherein the array of non-volatile memory comprises an array of non-volatile memory having a plurality of independently accessible blocks of non-volatile memory and wherein the address decoder comprises an address decoder operable to provide access to the blocks of non-volatile memory.

5. The non-volatile memory of claim 1 wherein the address decoder comprises an address decoder having a plurality of latches operable to be set in first or second states, each latch corresponding to a respective addressable region of the array, access to the addressable region of the array enabled in response to the respective latch having the first state and access to the addressable region of the array disabled in response to the respective latch having the second state.

6. The non-volatile memory of claim 5 wherein the control logic comprises control logic operable to set the latches of the address decoder to the first or second states in accordance with the data stored in the memory.

7. The non-volatile memory of claim 1 wherein the array of non-volatile memory comprises an array of NAND flash memory.

8. A memory having an array of non-volatile memory, the array divided into a plurality of individually accessible blocks, the memory comprising:
a plurality of activation circuits coupled to a respective one of the plurality of individually accessible blocks, each activation circuit operable to enable access to the respective block; and
a control circuit coupled to the plurality of activation circuits and operable in response to receiving a first valid command after a reset event to disable access to defective blocks of the array prior to executing the first valid command.

9. The memory of claim 8 wherein the plurality of activation circuits comprise circuits included in a address decoder circuit.

10. The memory of claim 8, further comprising a circuit for storing an indicator and wherein the control circuit comprises a control circuit operable to query a state of the indicator stored in the circuit in response to receiving a valid command, and in response to the indicator having a first state, read data stored in one of the blocks of the array, store an indicator having a second state and disable access to the blocks of the array identified by the data, and in response to the indicator having the second state, execute the valid command without disabling access to the blocks of the array identified by the data.

11. The memory of claim 10 wherein the circuit for storing an indicator comprises a latch operable to be set to either the first or second states.

12. The memory of claim 10 wherein the block of the array in which data is stored comprises a block of the array that is not accessible by a user.

13. The memory of claim 8 wherein the reset event occurs in response to the memory receiving power.

14. The memory of claim 8 wherein the array of non-volatile memory comprises an array of NAND flash memory.

15. A system, comprising:
a volatile memory operable to store data;
a processor coupled to the memory and operable to process data;
an input device coupled to the processor;
an output device coupled to the processor; and
a data storage coupled to the processor and operable to store data, the data storage comprising:
an array of non-volatile memory, the array divided into a plurality of individually accessible blocks;
a plurality of activation circuits coupled to a respective one of the plurality of individually accessible blocks, each activation circuit operable to enable access to the respective block; and
a control circuit coupled to the plurality of activation circuits and operable in response to receiving a first valid command after a reset event to disable access to defective blocks of the array prior to executing the first valid command.

16. The system of claim 15 wherein the plurality of activation circuits of the data storage comprise circuits included in a address decoder circuit.

17. The system of claim 15 wherein the data storage further comprises a circuit for storing an indicator and wherein the control circuit comprises a control circuit operable to query a state of the indicator stored in the circuit in response to receiving a valid command, and in response to the indicator having a first state, read data stored in one of the blocks of the array, store an indicator having a second state and disable access to the blocks of the array identified by the data, and in response to the indicator having the second state, execute the valid command without disabling access to the blocks of the array identified by the data.

18. The system of claim 17 wherein the circuit for storing an indicator comprises a latch operable to be set to either the first or second states.

19. The system of claim 17 wherein the block of the array in which data is stored comprises a block of the array that is not accessible by a user.

20. The system of claim 15 wherein the reset event occurs in response to the memory receiving power.

21. The system of claim 15 wherein the array of non-volatile memory of the data storage comprises an array of NAND flash memory.

* * * * *